(12) United States Patent
Song

(10) Patent No.: US 7,931,387 B2
(45) Date of Patent: Apr. 26, 2011

(54) LIGHT-EMITTING DIODE LIGHT SOURCE

(75) Inventor: Wen-Joe Song, Chung Ho (TW)

(73) Assignee: Kingbright Electronic Co., Ltd., Chung Ho (TW)

(*) Notice: Subject to any disclaimer, the term of this patent is extended or adjusted under 35 U.S.C. 154(b) by 292 days.

(21) Appl. No.: 12/138,745

(22) Filed: Jun. 13, 2008

(65) Prior Publication Data

US 2009/0189165 A1 Jul. 30, 2009

(30) Foreign Application Priority Data

Jan. 29, 2008 (TW) ............................... 97201931 U

(51) Int. Cl.
*F21V 23/00* (2006.01)
*F21V 9/16* (2006.01)
*F21S 4/00* (2006.01)

(52) U.S. Cl. ..................... 362/249.02; 362/84; 362/235; 362/800

(58) Field of Classification Search .................. 362/240, 362/84, 249.02, 235–237; 257/99, 100, 88, 257/E33.061; 313/498, 500, 506
See application file for complete search history.

(56) References Cited

U.S. PATENT DOCUMENTS

| | | | |
|---|---|---|---|
| 5,559,681 A * | 9/1996 | Duarte ........................... | 362/231 |
| 7,192,163 B2 * | 3/2007 | Park ............................... | 362/294 |
| 7,279,723 B2 * | 10/2007 | Matsumura et al. ........... | 257/100 |
| 7,445,354 B2 * | 11/2008 | Aoki et al. ...................... | 362/241 |
| 7,667,384 B2 * | 2/2010 | Chen et al. ..................... | 313/500 |
| 2007/0001188 A1 * | 1/2007 | Lee ................................ | 257/99 |

* cited by examiner

*Primary Examiner* — Alan Cariaso
(74) *Attorney, Agent, or Firm* — Rosenberg, Klein & Lee

(57) ABSTRACT

An LED light source comprises a lower substrate having an upper surface which is formed with a groove and covered with an insulating layer in an area outside the groove, wherein the insulating layer is partially covered with a metal layer; an upper substrate disposed on a top of the insulating layer and formed with an opening in an area corresponding to the groove; a plurality of sub-substrates disposed on an inner bottom portion of the groove, wherein each said sub-substrate has a surface covered with a circuit layer, adjacent said sub-substrates are electrically connected to each other at respective adjacent ends thereof by a first metal lead, and each said sub-substrate is provided thereon with a plurality of LED chips, in which each said LED chip is connected by a second metal lead to a corresponding electrical connection point; and a light-transmitting colloid filled in the groove and the opening. The plurality of LED chips are thus integrally packaged in the groove to form the LED light source, which can be easily manufactured while having a small volume and providing high brightness.

9 Claims, 7 Drawing Sheets

LIGHT-EMITTING DIODE LIGHT SOURCE

BACKGROUND OF THE INVENTION

1. Technical Field

The present invention relates to a light-emitting diode (LED) light source and, more particularly, to an LED light source wherein a plurality of LED chips are integrally packaged, so that the LED light source can be easily made while having a small volume and providing high brightness.

2. Description of Related Art

Light-emitting diodes are known for their long service life, low power-consumption and being environmentally friendly, and are therefore widely used as a light source in various fields. When LEDs are used for providing light, a single LED seldom satisfies the need of lighting because of its limited brightness. Therefore, a plurality of LEDs must be used at the same time to produce the desired lighting effect. Presently, it is a common practice to combine a plurality of single LED package structures together and secure them to an external device, wherein the LED package structures are driven by electricity.

For convenience of use, the existing technologies also provide a variety of individual LED module structures, and as many such module structures as needed can be secured to an external device and driven by electricity for use. A common LED module has a structure comprising a substrate, such as a printed circuit board, provided with a printed circuit pattern for transmitting electric signals; and a plurality of LED package structures arranged into a certain array and fixedly attached to the substrate to form the LED module, which can be fixedly attached to an external device or installed into a housing to form a light source.

However, in an LED module having the aforementioned conventional structure, every single LED must be individually packaged and then a plurality of package structures thus formed are assembled. Not only is the above process complicated but also the final product has a larger size and a more diffuse brightness. Now that a lot of products of today are designed with higher and higher precision to become more and more compact, the LED light sources used in these products must meet the requirement of having a small volume and a high brightness. And this requirement has indicated the limitation on the applications of LED modules having conventional structures.

SUMMARY OF THE INVENTION

Therefore, an objective of the present invention is to provide an LED light source wherein a plurality of LED chips are integrally packaged, so that the LED light source can be easily made while having a small volume and providing high brightness.

To achieve this end, the present invention provides an LED light source comprising:

a lower substrate having an upper surface which is formed with a groove and covered with an insulating layer in an area outside the groove, wherein the insulating layer is partially covered with a metal layer;

an upper substrate disposed on a top of the insulating layer and formed with an opening in an area corresponding to the groove;

a plurality of sub-substrates disposed on an inner bottom portion of the groove, wherein each said sub-substrate has a surface covered with a circuit layer, adjacent said sub-substrates are electrically connected to each other at respective adjacent ends thereof by a first metal lead, and each said sub-substrate is provided thereon with a plurality of LED chips, in which each said LED chip is connected by a second metal lead to a corresponding electrical connection point, and a light-transmitting colloid filled in the groove and the opening.

Thus, the plurality of LED chips are integrally packaged in the groove.

BRIEF DESCRIPTION OF THE DRAWINGS

The invention as well as a preferred mode of use, further objectives and advantages thereof will best be understood by reference to the following detailed description of an illustrative embodiment when read in conjunction with the accompanying drawings, wherein.

DETAILED DESCRIPTION OF THE PREFERRED EMBODIMENT

Figure 1:
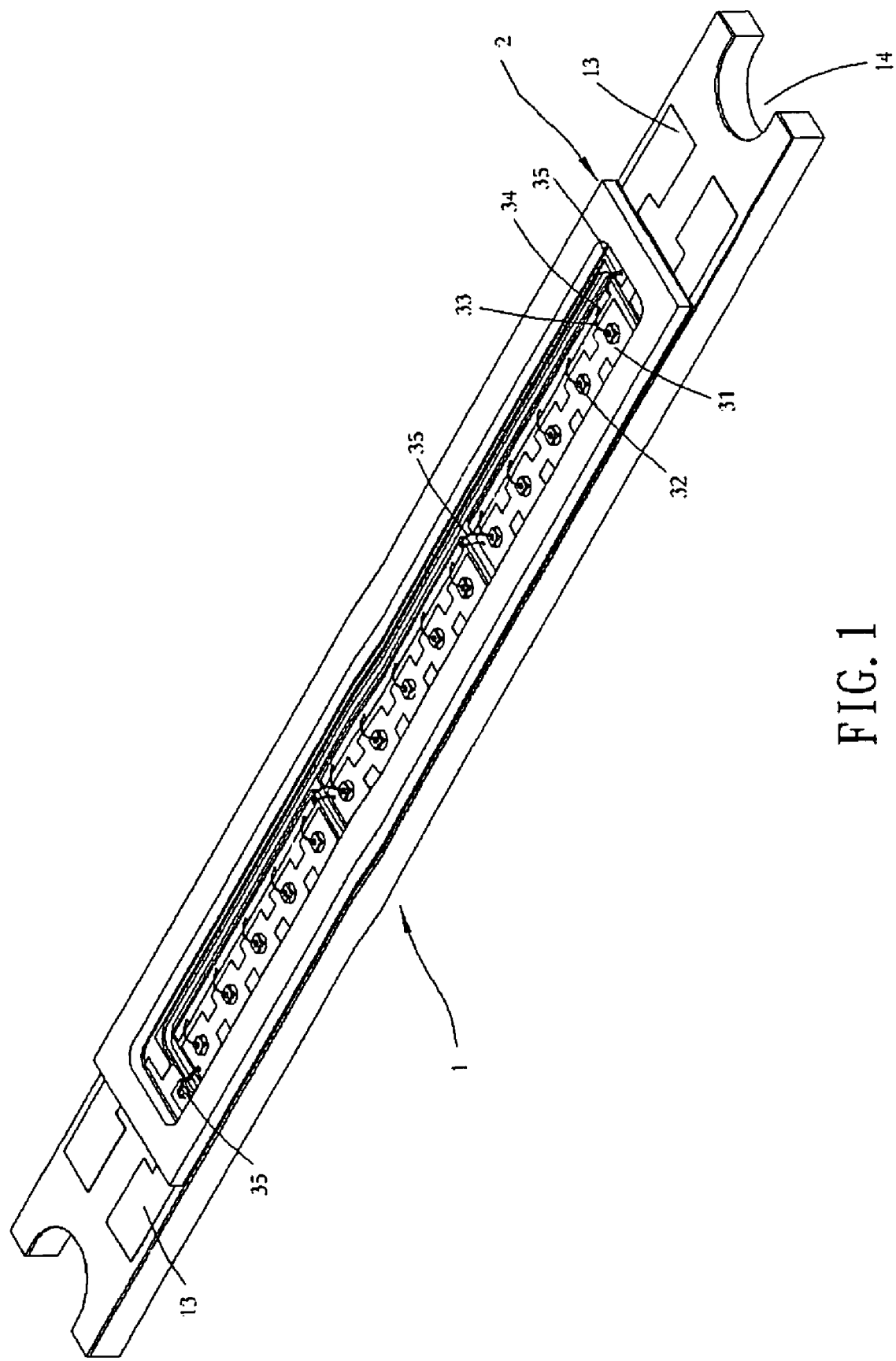
FIG. 1 is a schematic assembled view of an LED light source according to a preferred embodiment of the present invention.
Figure 2:
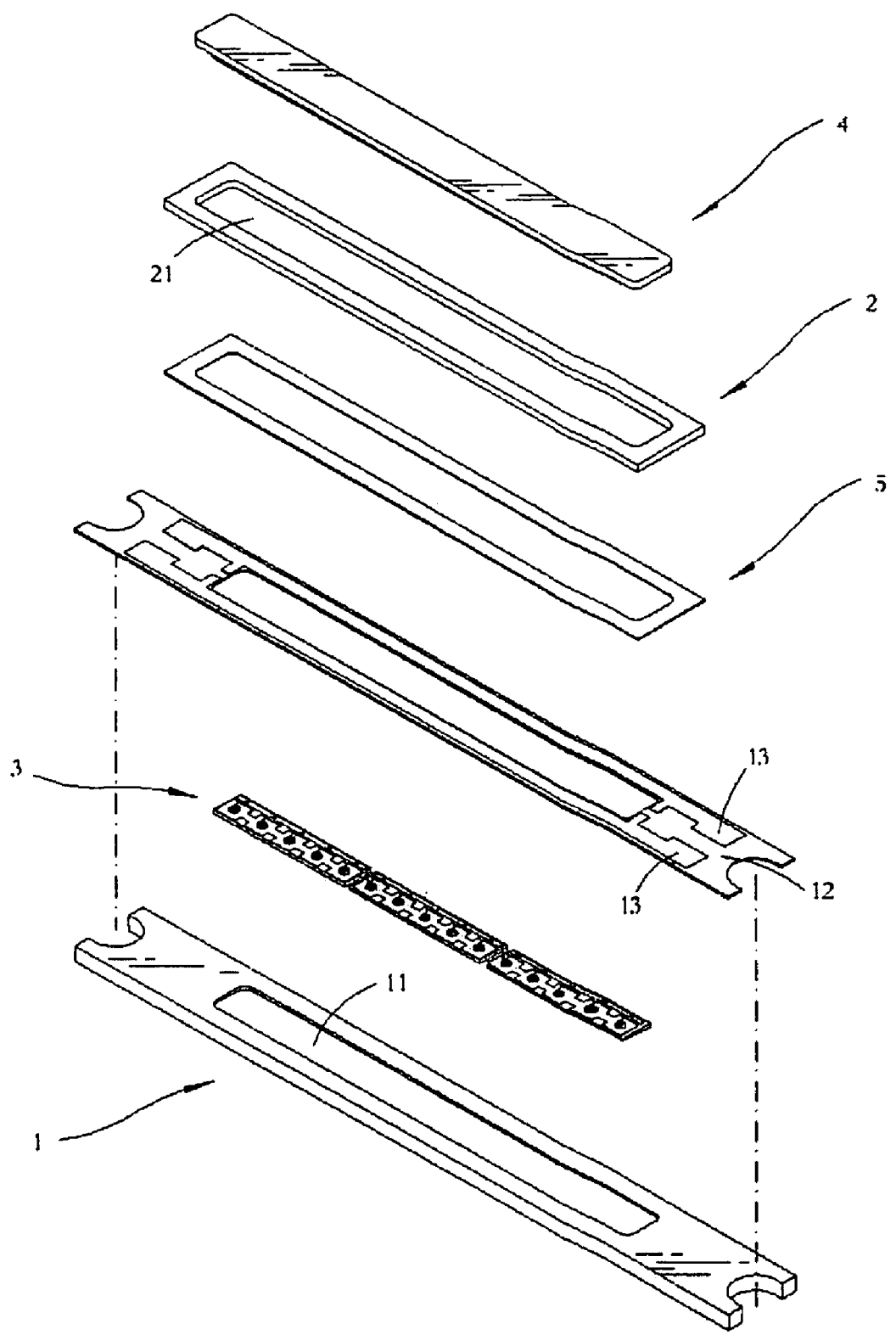
FIG. 2 is a perspective exploded view of the LED light source in FIG. 1.
Figure 3:
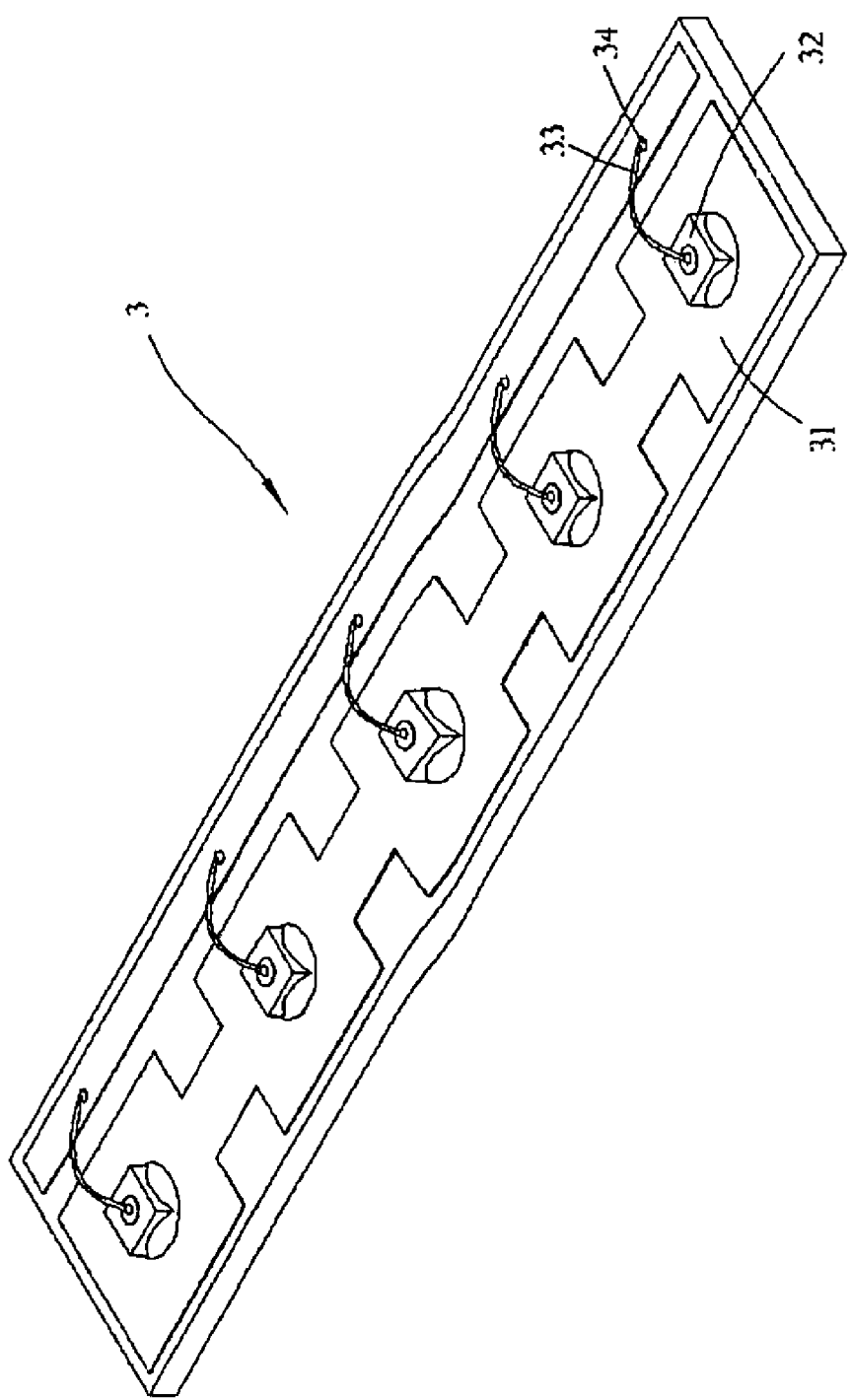
FIG. 3 is a schematic perspective view of a sub-substrate of the LED light source according to the preferred embodiment of the present invention.
Figure 4:
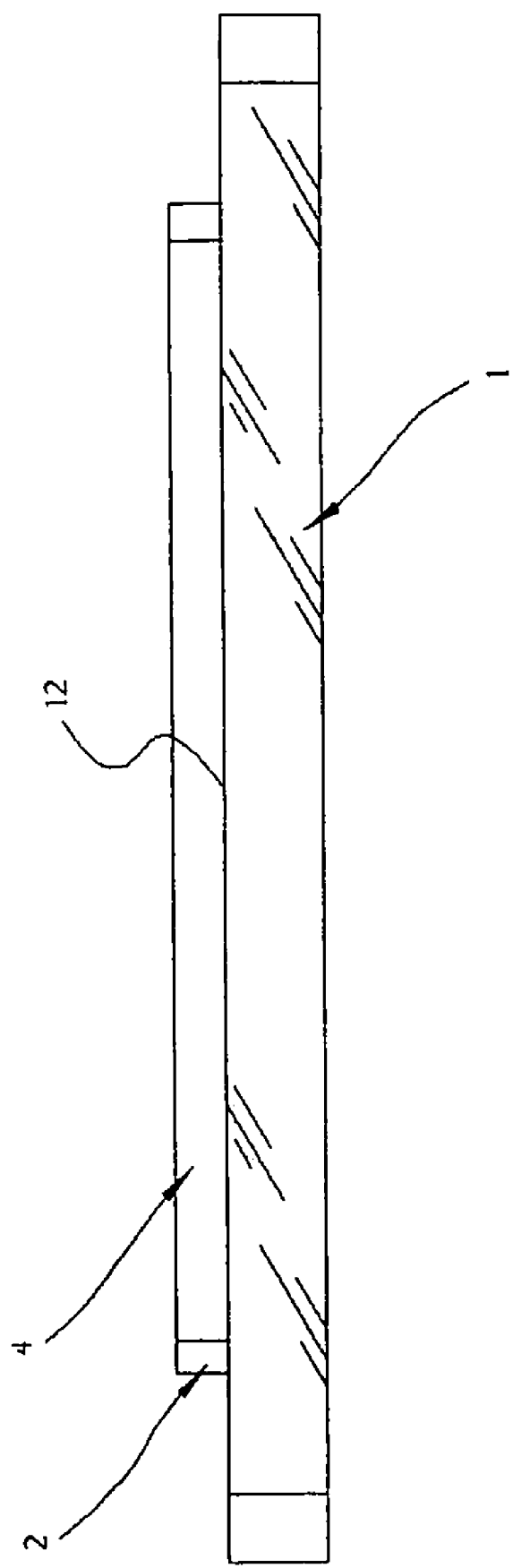
FIG. 4 is a schematic side view of the LED light source according to the preferred embodiment of the present invention.
Figure 5:
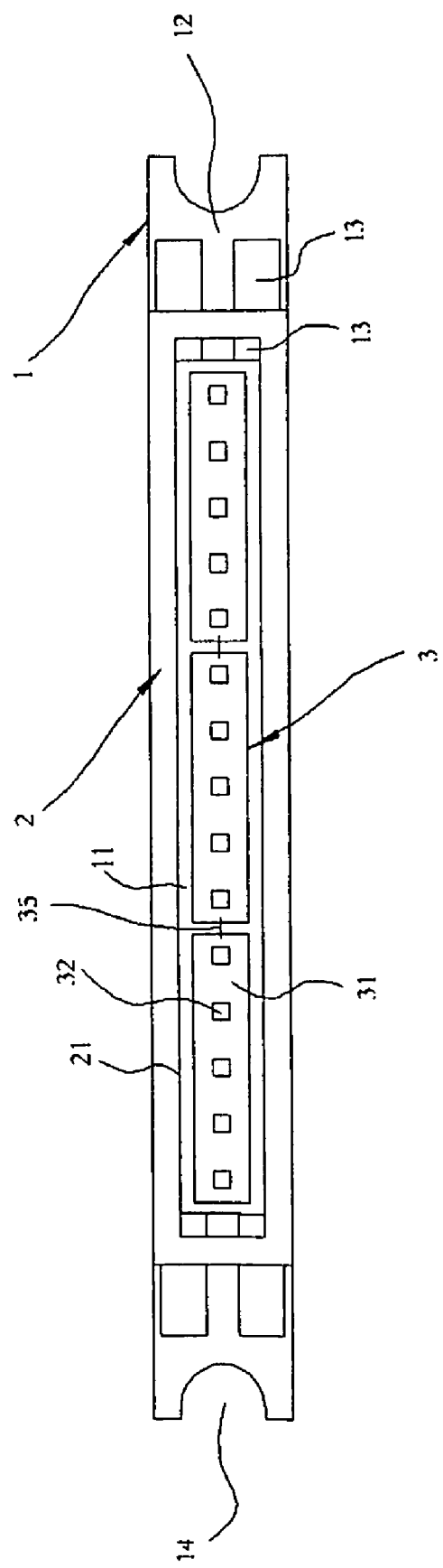
FIG. 5 is a schematic top view of the LED light source according to the preferred embodiment of the present invention, before a light-transmitting colloid is filled.
Figure 6:
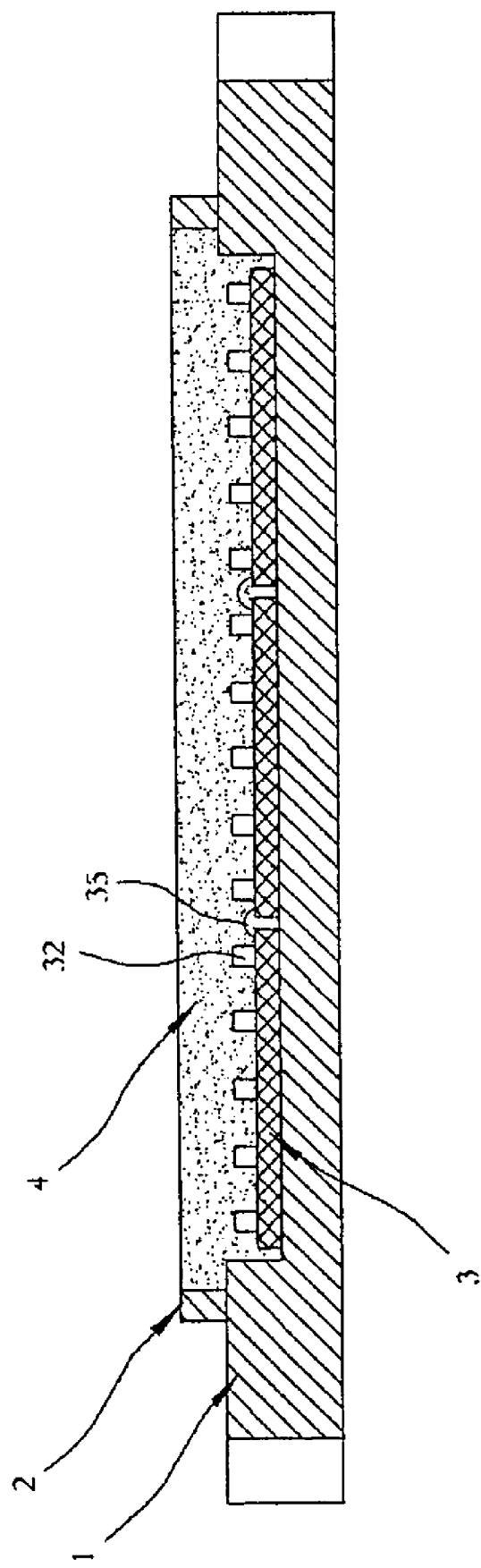
FIG. 6 is a schematic longitudinal cross-section of the LED light source according to the preferred embodiment of the present invention.
Figure 7:
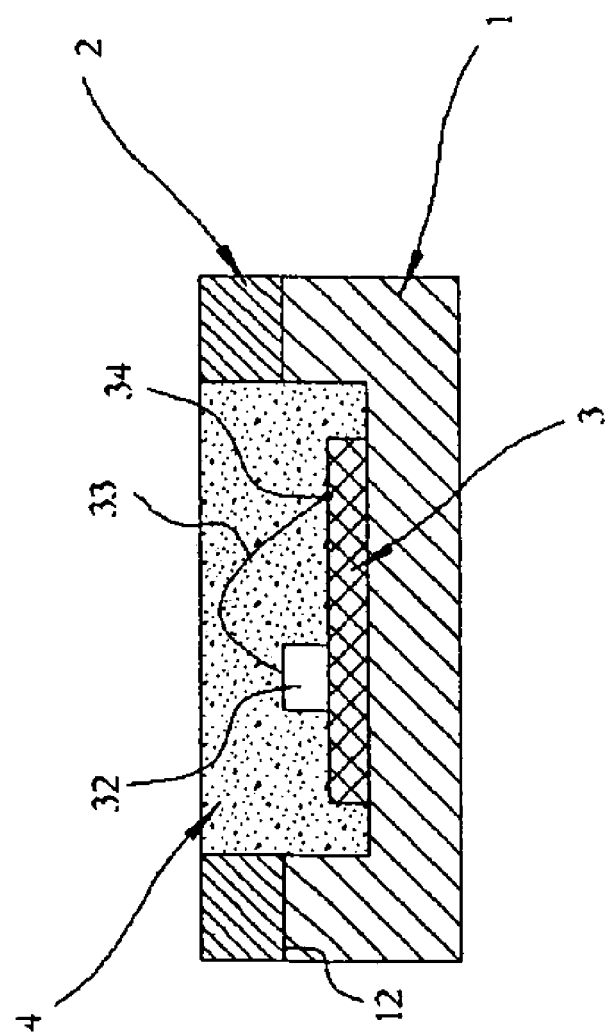
FIG. 7 is a schematic transverse cross-section of the LED light source according to the preferred embodiment of the present invention.

Referring to FIGS. 1 to 7, an LED light source according to a preferred embodiment of the present invention comprises a lower substrate 1, an upper substrate 2, a plurality of sub-substrates 3 and a light-transmitting colloid 4.

The lower substrate 1 is made of a metal having a high heat-conductivity, including but not limited to an aluminum plate. The lower substrate 1 has an upper surface which is formed with a groove 11 and covered with an insulating layer 12 in an area outside the groove 11, wherein the insulating layer 12 is partly covered with a metal layer 13 for electrical connection. The lower substrate 1 has two ends, each formed with an inwardly extending semicircular via hole 14, so that a resulting package structure can be secured to an external structure (not shown) with screws (not shown).

The upper substrate 2 is attached on top of the insulating layer 12 with an insulating bonding material (not shown) and made of a metal having a high heat-conductivity, including but not limited to an aluminum plate. The upper substrate 2 is formed with an opening 21 in an area corresponding to the groove 11, so that the opening 21 forms a window when viewed from above.

The plurality of sub-substrates 3 are disposed on an inner bottom portion of the groove 11, wherein each said sub-substrate 3 has a strip-shaped design and is made of a non-metal material, including but not limited to a silicon substrate. Each said sub-substrate 3 has a surface covered with a circuit layer 31 and is further provided thereon with a plurality of LED chips 32 arranged in a certain array, wherein each said LED chip 32 is connected by a second metal lead 33 to a corresponding electrical connection point 34, while adjacent said sub-substrates 3 are electrically connected to each other by a first metal lead 35. In other words, the plurality of LED chips 32 are disposed on each said silicon substrate, wherein an electrode of each said LED chip 32 is connected to the corresponding electrical connection point 34 on said silicon substrate by a chip wire (the second metal lead 33), while adjacent said silicon substrates are connected to each other at respective adjacent ends thereof by another chip wire (the first metal lead 35), so that the electrical connection points on the respective silicon substrates are connected.

The light-transmitting colloid 4 may contain a fluorescent substance and is filled into the groove 11 and the opening 21. That is to say, the window above the chips 32 is completely filled by the light-transmitting colloid 4 having the fluorescent substance.

The upper substrate 2 and the lower substrate 1 are bonded together with an insulating bonding material 5, wherein the lower substrate 1 has a thickness greater than a thickness of the upper substrate 2.

The sub-substrates 3 are arranged as needed and a foremost end and a rearmost end of said arranged sub-substrates 3 are each electrically connected to the metal layer 13 by another said first metal lead 35.

The upper substrate 2, the lower substrate 1 and the sub-substrates 3 in this embodiment are disclosed herein as having a strip-shaped design but are not limited to such design.

Referring to FIGS. 1 to 7, when the aforesaid components according to the present invention are to be assembled, the plurality of LED chips 32 are integrally packaged in the grooves 11, and the light-transmitting colloid 4 having the fluorescent substance is disposed over the chips 32 so as to fill the groove 11 and the opening 21. The LED light source thus formed can be easily made while having a small volume and providing a high brightness, thereby overcoming the problems of a prior art LED light source such as having a large volume, giving off a diffuse brightness and being difficult to manufacture.

In summary, compared with a conventional LED light source structure, the LED light source of the present invention is truly enhanced in performance by having such features as ease of manufacture, a smaller volume and a higher brightness. In addition, the present invention has never been disclosed in publications or openly used. This well-designed invention meets the requirements for patent application and an application for patent of the invention is now filed for examination.

What is claimed is:

1. A light-emitting diode (LED) light source, comprising:
a lower substrate, having an upper surface which is formed with a groove and covered with an insulating layer in an area outside the groove, wherein the insulating layer is partly covered with a metal layer for electrical connection; an upper substrate, disposed on top of the insulating layer and formed with an opening in an area corresponding to the groove;
a plurality of sub-substrates, disposed on an inner bottom portion of the groove, wherein each said sub-substrate has a surface covered with a circuit layer, adjacent said sub-substrates are electrically connected to each other at respective adjacent ends thereof by a first metal lead, and each said sub-substrate is provided thereon with a plurality of LED chips, in which each said LED chip is connected by a second metal lead to a corresponding electrical connection point, and
a light-transmitting colloid filled in the groove and the opening.

2. The LED light source as claimed in claim 1, wherein the lower substrate is made of a metal having a high heat-conductivity.

3. The LED light source as claimed in claim 1, wherein the upper substrate is made of a metal having a high heat-conductivity.

4. The LED light source as claimed in claim 1, wherein the sub-substrates are made of a non-metal material.

5. The LED light source as claimed in claim 1, wherein the light-transmitting colloid contains a fluorescent substance.

6. The LED light source as claimed in claim 1, wherein the upper substrate and the lower substrate are bonded together with an insulating bonding material.

7. The LED light source as claimed in claim 1, wherein the lower substrate has two ends, and each of the two ends is formed with an inwardly extending semicircular via hole.

8. The LED light source as claimed in claim 1, wherein the sub-substrates are arranged so that a foremost end and a rearmost end of said arranged sub-substrates are each electrically connected to the metal layer by another said first metal lead.

9. The LED light source as claimed in claim 1, wherein the upper substrate, the lower substrate and the sub-substrates have a strip-shaped design.

* * * * *